US006457033B1

(12) United States Patent
Nagano

(10) Patent No.: US 6,457,033 B1
(45) Date of Patent: Sep. 24, 2002

(54) METHOD OF PREDICTING DIFFUSION STATE AND APPARATUS FOR ANALYZING SAME

(75) Inventor: Seido Nagano, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/435,104

(22) Filed: Nov. 5, 1999

(30) Foreign Application Priority Data

Nov. 6, 1998 (JP) .......................................... 10-315690

(51) Int. Cl.$^7$ ................................................ G06F 7/38
(52) U.S. Cl. ...................................................... 708/443
(58) Field of Search ........................ 708/443, 403–409

(56) References Cited

U.S. PATENT DOCUMENTS 5,963,658 A  * 10/1999 Klibanov et al. ........... 382/128
6,185,472 B1  *  2/2001 Onga et al. .................. 700/121

* cited by examiner

*Primary Examiner*—Tan V. Mai
(74) *Attorney, Agent, or Firm*—Dickstein, Shapiro, Morin & Oshinsky, LLP

(57) ABSTRACT

An apparatus and method which is capable of solving a diffusion equation at a high precision by Fourier expansion. Diffusion quantity f, when a diffusion source s is provided, is determined by Fourier-transforming spacial components of $f(r, t)$ and $s(r, t)$ in both sides of $\partial f(r, t)/\partial t = s(r, t) + D\nabla^2 f(r, t)$, modifying each component into a differential equation of a form which is each of spacial frequency components obtained by the Fourier transformation and finite solving a finite difference equation $$f(t+\Delta t) = \exp(-c\Delta t)f(t) + (\Delta t/2)[\exp(-c\Delta t)s(t) + s(t+\Delta t)]$$

by a repeating method.

12 Claims, 3 Drawing Sheets

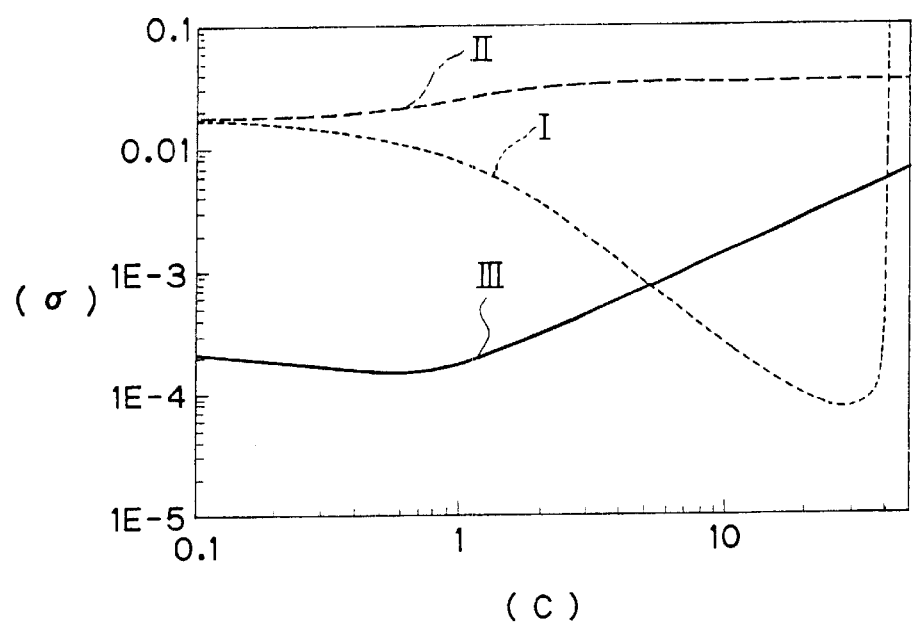
F I G. 2

METHOD OF PREDICTING DIFFUSION STATE AND APPARATUS FOR ANALYZING SAME

FIELD OF THE INVENTION

The present invention relates to a method and apparatus for solving a diffusion equation, and in particular to a method and apparatus for solving at a high precision a diffusion equation having a diffusion source or an electric field generating source in a space to be analyzed.

BACKGROUND OF THE INVENTION

In order to solve a differential equation in a data processing apparatus, a solving method is generally used to replace a first order differential df/dt with a form of finite difference $$(f(t+\Delta t)-f(t))/\Delta t \quad (9)$$

SUMMARY OF THE DISCLOSURE

However, the following problems have been encountered in the course of investigations toward the present invention. Namely, in order to solve, for example, a differential equation $df(x, t)/dt = \partial^2(f(x, t)/\partial^2 x$ where the diffusion coefficient D is 1, by a conventional method, it is necessary to make the finite difference (interval) $\Delta t$ of the parameter t for keeping the calculation precision higher than a given level.

This reason resides in that divergence may otherwise occur in the course of solution of the differential equation or the calculation precision would be lowered.

If the spacial components in both sides of the equation $df(x, t)/dt = \partial^2(f(x, t)/\partial^2 x$ are expanded into Fourier-series (termed as "Fourier expansion"), for example, $f = \Sigma f_1 \exp(-k_1 \cdot x)$, Fourier components in a form of $df(t)/dt = -k^2 f(t) = -cf(t)$ is obtained. However, it is in principle necessary to make the interval $\Delta t$ of the parameter t infinitely small since the value of c may assume from zero to infinity.

Therefore, it is hard or impossible for the conventional methods to achieve a computation at a high precision relying upon the Fourier expansion.

Accordingly, the present invent ion has been made to overcome the aforementioned problem. It is an object of the present invention to provide a totally novel method and apparatus which is capable of solving a diffusion equation at a high precision by the Fourier expansion.

According to a first aspect of the present invention, there is provided an apparatus for analyzing the diffusion state by analyzing diffusion quantity f in a space having a diffusion source therein by using a diffusion equation $\partial f(r, t)/\partial t = s(r, t) + D\nabla^2 f(r, t)$ in which a partial differential f the f with respect to time $\partial f(r, t)/\partial t$ (where r denotes spacial vector and t denotes time) is equal to the sum of the diffusion source s and a product of a diffusion coefficient D and a second order differential ($\nabla^2 f$) of a gradient ($\nabla$) of the f, to determine the diffusion quantity f in the space. The apparatus comprises (a) means for Fourier-transforming spacial components with respect to f(r, t) and s(r, t) in both sides of the diffusion equation;

(b) means for modifying each of the Fourier components obtained by the Fourier-transformation into a differential equation having a form $df(t)/dt = s(t) - cf(t)$ representing each spacial frequency component, where f(t) and s(t) are Fourier components of f(r, t) and s(r, t), respectively, and c includes a component of square of wave number k, and the boundary conditions of f(t) may be appropriately determined;

(c) means for solving the differential equation relating to the Fourier components by repeating the finite difference method using a given finite difference equation relating to $f(t+\Delta t)$, $f(t)$ and $s(t)$ in which $f(t)$ and $s(t)$ are multiplied by a value of an exponential function $\exp(-c\Delta t)$ having a product of the c and a time interval $\Delta t$ with a minus sign on its shoulder; and (d) means for summing up the solutions of the differential equations relating to the Fourier components which are obtained by the finite difference equations to output the sum as a solution of the original diffusion equation.

The means for solving the differential equation relating to the Fourier components by the finite difference method is adapted to solve a difference equation represented as $f(t+\Delta t) = \exp(-c\Delta t)f(t) + (\Delta t/2)[\exp(-c\Delta t)s(t) + s(t+\Delta t)]$ by the repeating method (i.e., repeating the calculus).

According to a second aspect of the present invention, there is provided a method of predicting the diffusion state. The method is characterized by the steps of:

(a) Fourier-transforming space-dependent components in a differential equation $$d\vec{f}(\vec{r},t)/dt = \vec{s}(\vec{r},t) + D\nabla^2 \vec{f}(\vec{r},t) \quad (3)$$

which is related with a position vector $$\vec{r} \quad (1)$$

and the strength of an electric field at time t $$\vec{f} \quad (2)$$

where $$\vec{s} \quad (4)$$

denotes vector in an electric field generating term, and D denotes diffusion coefficient of the electric field;

(b) and transforming each of the Fourier components into a differential equation having a form $$d\vec{f}(t)/dt = \vec{s}(t) - c\vec{f}(t) \quad (5)$$

where f and $$\vec{f}, \vec{s} \quad (6)$$

denote vector and scalar quantities, respectively, with $$\vec{f}(0) = 0 \quad (7);$$

(c) numerically solving the differential equations; and (d) thereafter determining, as a solution, the sum of respective Fourier components.

In a third aspect of the present invention, the invention 5 provides a method of predicting the diffusion state in case where f and s are scalar quantities.

In accordance with the present invention, the problem that requires to make the interval (infinite difference) of the parameter t small in order to keep the calculus precision not lower than a given level as the value c increases.

The present invention is not limited to the calculation of the strength (intensity) of an electric field, but is applicable to all phenomena which may occur due to the diffusion effect such as concentration etc.

Other aspects and features of the present invention are fully mentioned in the appended claims, which disclosure is herein incorporated by reference thereto. Also other features will become apparent in the entire disclosure including the drawings.

BRIEF DESCRIPTION OF THE DRAWINGS

FIG. 2 is a graph explaining the operation and advantage of one example of the present invention and showing the dependency of the value of c upon the relative error from the exact calculated solution.

PREFERRED EMBODIMENTS OF THE INVENTION

Figure 3:
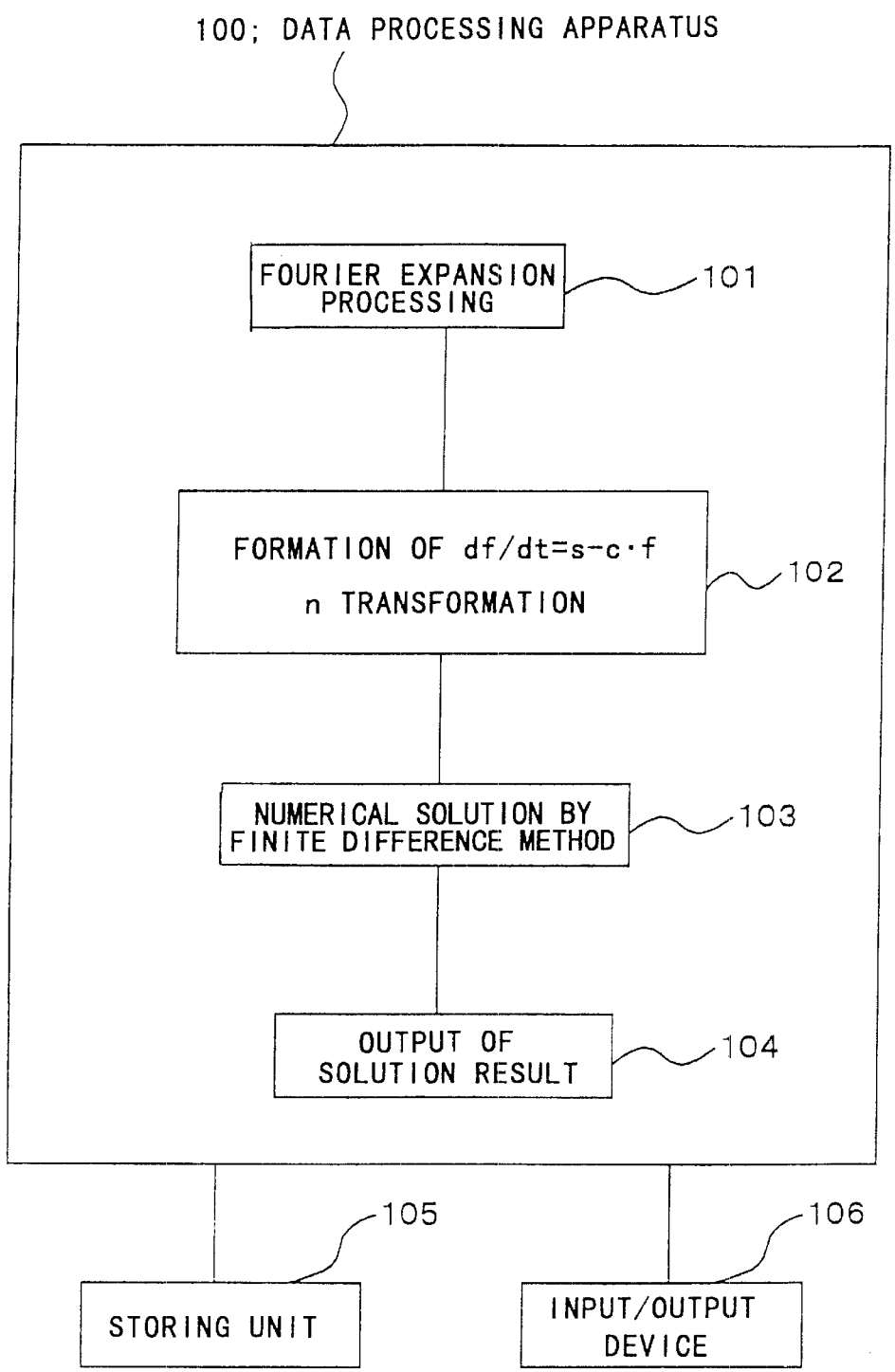
FIG. 3 is a flow chart showing the configuration of one embodiment of the present invention.

A mode of embodying the invention will now be described. Referring now to FIG. 3, in a data processing apparatus 100 the diffusion quantity f in a space having a diffusion source therein is analyzed by using a diffusion equation $$\partial f(r,t)/\partial t = s(r,t) + D\nabla^2 f(r,t)$$

in which a partial differential of said f with respect to time $\partial f(r, t)/\partial t$ (where r denotes spacial vector and t denotes time) is equal to the sum of the diffusion source s and the product of the diffusion coefficient D and the differential of second order ($\nabla^2 f$, $\nabla^2 =$ div(grad)) of the gradient ($\nabla =(\partial/\partial x)e_x+(\partial/\partial y)e_y+(\partial/\partial z)e_z$ where $e_x$, $e_y$, and $e_z$ are unit vectors) of said f, to determine the diffusion quantity f in said space. Referring now to FIG. 3, the data processing apparatus comprises processing (Fourier-transforming) means (101) for Fourier-transforming the spacial components with respect to f(r, t) and s(r, t) in both sides of the diffusion equation; processing (differential equation formulating) means (102) for modifying each of Fourier components into a differential equation having a form df(t)/dt=s(t)−cf(t) representing each spacial component which is obtained by the Fourier transformation, where f(t) and s(t) are Fourier components of f(r, t) and s(r, t), respectively, and c denotes a matrix having the square of the number of waves k as a component when f is vector and c denotes scalar when f is scalar; processing (finite difference method-solving) means (103) for solving said differential equation relating to Fourier components by repeating the finite difference method using a given difference equation relating to f(t+Δt), f(t) and s(t) in which f(t) and s(t) are multiplied by a value exp(−cΔt) i.e., an exponential function having the product of the c and the time interval Δt with a minus sign on its shoulder, to store numerical solutions in a storing unit (105); and processing (result outputting) means (104) that sums up the solutions of the differential equations relating to the Fourier components which are obtained by the difference equation to output the resultant sum as a solution of the original diffusion equation to an output device (106).

The means for solving the differential equation relating to the Fourier components by the difference method is adapted to solve a difference equation represented as $$f(t+\Delta t)=\exp(-c\Delta t)f(t)+(\Delta t/2)[\exp(-c\Delta t)s(t)+s(t+\Delta t)]$$

by the repeating method.

In this mode of embodying the invention, the product cΔt is cancelled out even when the time interval Δt is small and c is large due to the fact that the term exp(−cΔt) is included in the difference equation in order to keep the calculus preci-sion in a certain given level or above, so that occurrence of divergence is avoided in the course of solution of the difference equation wing to the minus signed value −cΔt on the shoulder of the exponential function.

In the mode of embodying the present invention, each means may be implemented by a program control executed on a computer. The present invention may include a medium having the program or program product, e.g., recording medium on which the program is stored or carried. The invention can be embodied by reading the program stored on the recording medium for execution thereof.

The medium may be static or dynamic, and may include those carrying the program product in any physical form and state, e.g., carrier wave which may be transmitted via communication system, wired or wireless, such as a network or satellite communication system.

Since df(t)/dt=s(t)−cf(t) which are Fourier components (spacial frequency components) with respect to each wave number k are completely independent to each other, the processing (103 in FIG. 3) for solving this differential equation using a method of repeating a difference equation $$f(t+\Delta t)=\exp(-c\Delta t)f(t)+(\Delta t/2)[\exp(-c\Delta t)s(t)+s(t+\Delta t)]$$

can be carried out, for example, by parallel processing by means of a parallel type multiprocessor comprised of a plurality of computers.

EXAMPLE

An example 1 of the present invention will now be described.

The following equation is used as a differential equation in which the diffusion equation representing the strength (intensity) of an electric field f is converted into the aforementioned equation (5).

$$df(t)/dt = \sin t - f(t) f(0) = 0 \tag{10}$$

This differential equation (10) is solved using the following equation (11) in which the time interval is set as Δt=0.05.

$$f(t+\Delta t)=\exp(-\Delta t)f(t)+(\Delta t/2)[\exp(-\Delta t)\sin t+\sin(t+\Delta t)] \tag{11}$$

The output result of the solution is compared to the following exact solution of the aforementioned differential equation.

$$f(t)=[\sin t - \cos t + \exp(-t)]/2 \tag{12}$$

Figure 1:
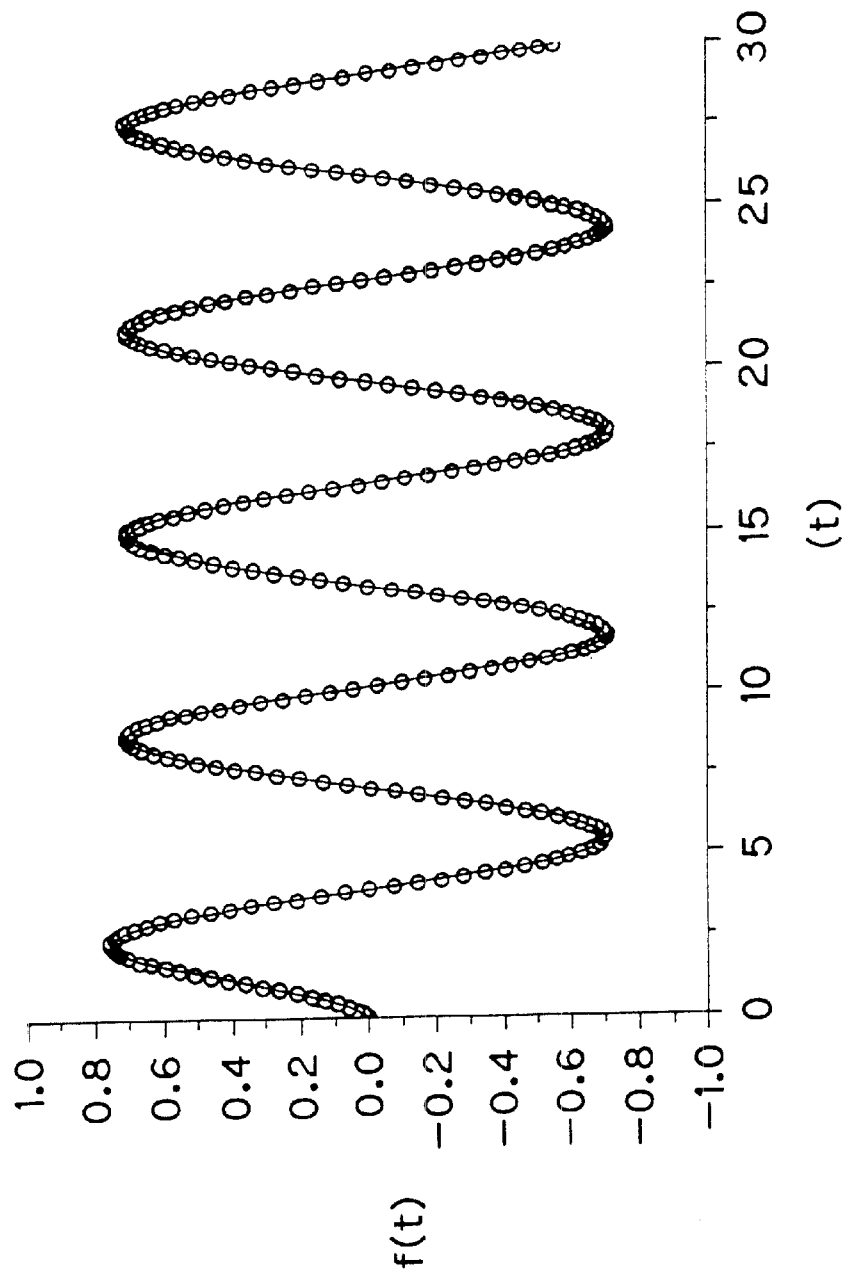
FIG. 1 is a graph showing an example of a solution of the differential equation of an electric field in one example of the present invention.

The results of comparison are shown in FIG. 1.

In FIG. 1, black circles denote solutions which have been calculated in Example 1. Solid line denotes a line on which exact solutions (solutions by analysis) are plotted.

$$df(t)/dt = \sin t - cf(t), f(0)=0 \tag{13}$$

A solution of the analysis of equation (13) is represented by the following expression (14).

$$f(t)=(c^2+1)^{-1}[c \sin t - \cos t + \exp(-ct)] \tag{14}$$

This analysis solution is used in a further processing as follows:

Two reference equations (15, 16) which have heretofore been generally used are expressed as follows:

$$f(t+\Delta t)=(1-c\Delta t)f(t)+\Delta t \sin t \text{ (Case I)} \tag{15}$$

$$f(t+\Delta t)=(1+c\Delta t)^{-1}f(t)+\Delta t \sin t \text{ (Case II)} \tag{16}$$

New finite difference equation which is shown in Example 1 is expressed as follows:

$$f(t+\Delta t)=\exp(-c\Delta t)f(t)+(\Delta t/2)[\exp(-c\Delta t)\sin t+\sin(t+\Delta t)] \quad \text{(Case III)} \quad (17)$$

Relative error (deviation) in a region $0\leq t\leq 2\pi$ is expressed as follows:

$$\sigma(c)=\sqrt{\left(\sum_{i=1}^{N}f_i-f_i^{exact}\right)^2/N} \quad (18)$$

The relative deviations for the cases I, II and III are calculated by the equation (18) where $f_i$ is defined by equation (19):

$$f_i=f(\Delta t-(i-1))f_i^{exact} \quad (19)$$

provided that $f_i^{exact}$ is the value of the solution of analysis, $\Delta t=0.05$ and $N=12.5$. The results are shown in FIG. 2.

In FIG. 2, I, II and III denote equation (15) (conventional method, Case I), equation (16) (conventional method, Case II) and equation (17) (example 1, Case III).

The aforementioned equation (15) (I in FIG. 2) diverges around the c value at 40. The equation (16) (II in FIG. 2) can avoid divergence from occurring, but has a low calculation precision. In contrast to this, the equation of example 1 (17) causes no divergence and the calculation precision is improved by two or three digits.

In accordance with the present invention, no divergence will occur and a higher accurate solution can be obtained with respect to the value of c which varies in a wider range than that of conventional method in the case where the time interval $\Delta t$ of the time t is set constant.

In the present invention, f and s may be scalar quantity such as heat amount and the like in the thermal diffusion equation other than the vector quantity such as electric field. Regarding to the application of the present invention, present invention is capable of numerically solving at a high precision a diffusion equation having a varying electric field generating source in a space. The present invention is applicable in a preferable fashion to the analysis of an electric field in a space, for instance, in the case where if mutually communicating plural devices are relatively moving so that the state of electric field generating sources is influenced by the communicating devices by themselves.

According to a further aspect of the present invention, the aforementioned process is carried out by a program or program product embodying (carrying) the respective steps. Particular reference is made to a recording medium carrying the program which performs the processing to operate the relevant method and apparatus.

The meritorious effects of the present invention are summarized as follows.

As mentioned above, in accordance with the present invention, there is provided an advantage in that no divergence occur and higher precision solution can be obtained over the value of c in a wider range than that of the conventional method in the case where the time interval t is made constant upon solving the diffusion equation by Fourier expansion.

It should be noted that other objects and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An apparatus for analyzing a diffusion state by analyzing diffusion quantity f in a space having a diffusion source therein by using a diffusion equation $$f(r, t)/\partial t=s(r, t)+D\nabla^2 f(r, t)$$

in which a partial differential of said f with respect to time $\partial f(r, t)/\partial t$, where r denotes spacial vector and t denotes, time is equal to a sum of the diffusion source s and a product of a diffusion coefficient D and a second order differential $\nabla^2 f$ of a gradient $\nabla$ of said f, to determine the diffusion quantity f in said space, wherein said apparatus comprises:

(a) means for Fourier-transforming spacial components with respect to f(r, t) and s(r, t) in both sides of said diffusion equation;

(b) means for modifying each of the Fourier components obtained by the Fourier-transformation into a differential equation having a form df(t)/dt=s(t)−cf(t) representing each spacial frequency component where f(t) and s(t) are Fourier components of f(r, t) and s(r, t), respectively, c includes a component of square of wave number k, and boundary conditions of f(t) may be appropriately determined;

(c) means for solving said differential equation relating to the Fourier components by repeating a finite difference method using a given finite difference equation relating to $f(t+\Delta t)$, f(t) and s(t) in which f(t) and s(t) are multiplied by a value of an exponential function having a product of said c and a time interval $\Delta t$ with a minus sign on its shoulder, respectively; and (d) means for summing up the solutions of the differential equations relating to said Fourier components which are obtained by the finite difference equation to output the sum as a solution of the original diffusion equation.

2. An analyzing apparatus as defined in claim 1, wherein said means for solving said differential equation relating to the Fourier components by the finite difference method is adapted to solve a difference equation represented as $$f(t+\Delta t)=\exp(-c\Delta t)f(t)+(\Delta t/2)[\exp(-c\Delta t)s(t)+s(t+\Delta t)]$$

by the repeating method.

3. An analyzing apparatus for determining electric field in a space to be analyzed by analyzing electric field vector f in said space having a diffusion source therein by using a diffusion equation $\partial f(r, t)/\partial t=s(r, t)+D\nabla^2 f(r, t)$ in which a partial differential of said electric field f with respect to time $\partial f(r, t)/\partial t$, where r denotes spacial vector and t denotes time, is equal to the sum of a diffusion source s and the product of a diffusion coefficient D and a second order differential $\nabla^2 f$ of a gradient $\nabla$ of said f, wherein said apparatus comprises:

(a) means for Fourier-transforming spacial components with respect to f(r, t) and s(r, t) in both sides of said diffusion equation;

(b) means for modifying each of the Fourier components obtained by the Fourier transformation into a differential equation having a form df(t)/dt=s(t)−cf(t) representing each spacial frequency component where f(t) and s(t) are Fourier components of f(r, t) and s(r, t), respectively, c denotes a matrix having square of wave number k as a component, and boundary conditions are appropriately determined;

(c) means for solving said differential equation relating to the Fourier components by repeating numerical computation based on a difference method using a given finite difference equation relating to f(t+Δt), f(t) and s(t) in which f(t) and s(t) are multiplied by a value of an exponential function having a product of said c and the time interval Δt with a minus sign on its shoulder; and (d) means for summing up the solutions of the differential equations relating to said Fourier components which are obtained by the finite difference equation to output the sum as a solution of the original diffusion equation.

4. An analyzing apparatus for analyzing the diffusion state as defined in claim 3, wherein said means for solving said differential equation relating to the Fourier components by the finite difference method is adapted to solve a finite difference equation represented as $$f(t+\Delta t)=\exp(-c\Delta t)f(t)+(\Delta t/2)[\exp(-c\Delta t)s(t)+s(t+\Delta t)]$$

by a repeating method.

5. A medium carrying a program of an analyzing method which is carried out in an apparatus for analyzing an electric field f in a space to be analyzed by analyzing the electric field f in said space having an electric field generating source therein by using a diffusion equation $\partial f(r, t)/\partial t = s(r, t)+D\nabla^2 f(r, t)$ in which a partial differential of said f with respect to time $\partial f(r, t)/\partial t$, where r denotes spacial vector and t denotes time, is equal to the sum of the diffusion source s and a product of a diffusion coefficient D and a second order differential $\nabla^2 f$ of the gradient ($\nabla$) of said f to determine the electric field in said space, wherein said method comprises:

(a) Fourier-transforming spacial components with respect to f(r, t) and s(r, t) in both sides of said diffusion equation;

(b) modifying each of the Fourier components obtained by said Fourier transformation into a differential equation having a form df(t)/dt=s(t)−cf(t) representing each spacial frequency component where f(t) and s(t) are Fourier components of f(r, t) and s(r, t), respectively, c denotes square of wave number k, and initial condition of f(0) is zero;

(c) solving said differential equation relating to the Fourier components by repeating a finite difference method using a given finite difference equation relating to $$f(t+\Delta t)=\exp(-c\Delta t)f(t)+(\Delta t/2)[\exp(-c\Delta t)s(t)+s(t+\Delta t)];$$

and (d) summing up the solutions of the differential equations relating to said Fourier components to output and display the sum as a solution of the original diffusion equation to an output device.

6. A medium as defined in claim 5, wherein said medium is computer-readable and comprises recording medium recorded thereon said program.

7. A method of predicting a diffusion state, wherein said method comprises:

(a) Fourier-transforming space-dependent components in a differential equation $$\partial \vec{f}(\vec{r}, t)/\partial t = \vec{s}(\vec{r}, t)+D\nabla^2 \vec{f}(\vec{r}, t)$$

which is related with position vector $\vec{r}$ and the strength of an electric field $\vec{f}$ at time t where $\vec{s}$ denotes vector in an electric field generating term, and D denotes diffusion coefficient of the electric field;

(b) transforming each of the Fourier components into a differential equation having a form $$d\vec{f}(t)/dt = \vec{s}(t)-c\vec{f}(t)$$

where f and $\vec{f}, \vec{s}$ denote vector quantity and scalar quantity, respectively, with $\vec{f}(\mathbf{0})=0$ (c) numerically solving the differential equations; and (d) thereafter determining as a solution a sum of respective Fourier components.

8. A method of predicting the diffusion state as defined in claim 7, wherein in solving the Fourier components of the diffusion equation which is expressed as the differential equation $$d\vec{f}(t)/dt = \vec{s}(t)-c\vec{f}(t)$$

wherein a finite difference equation $$\vec{f}(t+\Delta t)=\exp(-c\Delta t)\vec{f}(t)+(\Delta t/2)[\exp(-c\Delta t)\vec{s}(t)+\vec{s}(t+\Delta t)],$$

in which the c part of the equation (5) is separated into terms by bearing a minus signed value on the shoulder of an exponential function, is solved by a repeating method.

9. A method of analyzing a diffusion state by analyzing a diffusion quantity f in a space having a diffusion source therein by using a diffusion equation $\partial f(r, t)/\partial t = s(r, t)+D\nabla^2 f(r, t)$ in which a partial differential of said f with respect to time $\partial f(r, t)/\partial t$, where r denotes spacial vector and t denotes time, is equal to a sum of the diffusion source s and a product of a diffusion coefficient D and a second order differential $\nabla^2 f$ of a gradient $\nabla$ of said f, to determine the diffusion quantity f in said space, wherein said method comprises:

(a) Fourier-transforming spacial components with respect to f(r, t) and s(r, t) in both sides of said diffusion equation;

(b) modifying each of Fourier components into a differential equation having a form df(t)/dt=s(t)−cf(t) representing each spacial frequency component which is obtained by the Fourier transformation where f(t) and s(t) are Fourier components of f(r, t) and s(r, t), respectively, and c includes square of wave number k as a component, with boundary conditions of f(t) being appropriately determined;

(c) solving said differential equation relating to the Fourier components by repeating a finite difference method using a given finite difference equation relating to $$f(t+\Delta t)=\exp(-c\Delta t)f(t)+(\Delta t/2)[\exp(-c\Delta t)s(t)+s(t+\Delta t)]$$

relating to f(t+Δt), f(t) and s(t) in which f(t) and s(t) are multiplied by a value of an exponential function having a product of said c and time interval t with a minus sign on its shoulder, respectively; and (d) summing up solutions of the differential equation relating to said Fourier components which are obtained by the finite difference equation to output the sum as a solution of the original diffusion equation.

10. A program product which is adapted to perform in a computer a method of predicting a diffusion state, wherein said method comprises:

(a) Fourier-transforming space-dependent components in a differential equation $$\partial \vec{f}(\vec{r}, t)/\partial t = \vec{s}(\vec{r}, t)+D\nabla^2 \vec{f}(\vec{r}, t)$$

which is related with position vector $\vec{r}$ and the strength of an electric field $\vec{f}$ at time t where $\vec{s}$ denotes vector in an electric field generating term, and D denotes diffusion coefficient of the electric field;

(b) transforming each of the Fourier components into a differential equation having a form $$d\vec{f}(t)/dt = \vec{s}(t) - c\vec{f}(t) \qquad 5$$

where f and $\vec{f}, \vec{s}$ denote vector quantity and scalar quantity, respectively, with $\vec{f}(0)=0$ (c) numerically solving the differential equations; and (d) thereafter determining as a solution a sum of respective Fourier components.

11. A program product as defined in claim 10, wherein in solving the Fourier components of the diffusion equation which is expressed as the differential equation $$d\vec{f}(t)/dt = \vec{s}(t) - c\vec{f}(t)$$

wherein a finite difference equation $$\vec{f}(t+\Delta t) = \exp(-c\Delta t)\vec{f}(t) + (\Delta t/2)[\exp(-c\Delta t)\vec{s}(t) + \vec{s}(t+\Delta t)],$$

in which the c part of the equation at (b) is separated into terms by bearing a minus signed value on the shoulder of an exponential function, is solved by a repeating method.

12. A machine readable program product which is adapted to perform in a computer a method of analyzing a diffusion state by analyzing a diffusion quantity f in a space having a diffusion source therein by using a diffusion equation $\partial f(r, t)/\partial t = s(r, t) + D\nabla^2 f(r, t)$ in which a partial differential of said f with respect to time $\partial f(r, t)/\partial t$, where r denotes spacial vector and t denotes time, is equal to a sum of the diffusion source s and a product of a diffusion coefficient D and a second order differential $\nabla^2 f$ of gradient $\nabla$ of said f, to determine the diffusion quantity f n said space, wherein said method comprises:

(a) Fourier-transforming spacial components with respect to f(r, t) and s(r, t) in both sides of said diffusion equation;

(b) modifying each of Fourier components into a differential equation having a form df(t)/dt=s(t)−cf(t) representing each spacial frequency component which is obtained by the Fourier transformation where f(t) and s(t) are Fourier components of f(r, t) and s(r, t) respectively, and c includes square of wave number k as a component, with boundary conditions of f(t) being appropriately determined;

(c) solving said differential equation relating to the Fourier components by repeating a finite difference method using a given finite difference equation relating to $$f(t+\Delta t) = \exp(-c\Delta t)f(t) + (\Delta t/2)[\exp(-c\Delta t)s(t) + s(t+\Delta t)]$$

relating to f(t+Δt), f(t) and s(t) in which f(t) and s(t) are multiplied by a value of an exponential function having a product of said c and time interval t with a minus sign on its shoulder, respectively; and (d) summing up solutions of the differential equation relating to said Fourier components which are obtained by the finite difference equations to output the sum as a solution of the original diffusion equation.

* * * * *